United States Patent
Ramanan et al.

(10) Patent No.: US 10,474,785 B2
(45) Date of Patent: Nov. 12, 2019

(54) PRINTED CIRCUIT BOARD VOID INFORMATION GENERATION USING PARAMETER-BASED RULE SETS

(71) Applicant: Juniper Networks, Inc., Sunnyvale, CA (US)

(72) Inventors: Venkata G Ramanan, San Jose, CA (US); John P. Nguyen, San Jose, CA (US); Santosh Kumar Pappu, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 92 days.

(21) Appl. No.: 15/845,784

(22) Filed: Dec. 18, 2017

(65) Prior Publication Data

US 2019/0188355 A1 Jun. 20, 2019

(51) Int. Cl.
*G06F 17/50* (2006.01)
(52) U.S. Cl.
CPC ............... *G06F 17/5081* (2013.01)
(58) Field of Classification Search
CPC .................................................. G06F 17/5081
USPC ................................................. 716/111, 112
See application file for complete search history.

(56) References Cited

U.S. PATENT DOCUMENTS

| | | | | |
|---|---|---|---|---|
| 8,595,667 | B1* | 11/2013 | Shroff | G06F 17/5077 716/111 |
| 2018/0025106 | A1* | 1/2018 | Chobanyan et al. | G06F 17/5081 716/112 |
| 2018/0121694 | A1* | 5/2018 | Gao et al. | G06K 7/10732 |

OTHER PUBLICATIONS

Hamman et al.,"Trend Inspection Station for Printed Circuit Board Solder Joints", Apr. 6, 1979, Battelle—Columbus Laboratories, Final Report, one set.*

* cited by examiner

*Primary Examiner* — Sun J Lin
(74) *Attorney, Agent, or Firm* — Harrity & Harrity, LLP

(57) ABSTRACT

A device receives void configuration information that identifies a set of rules for generating void information based on printed circuit board (PCB) design information, and receives, based on receiving the void configuration information, the PCB design information that identifies via information of a PCB. The device compares, based on receiving the PCB design information, the set of rules, associated with the void configuration information, and the via information associated with the PCB design information, and generates the void information based on comparing the set of rules, associated with the void configuration information, and the via information associated with the PCB design information. The void information includes a set of parameters associated with a set of voids to be included in the PCB. The device performs an action based on generating the void information.

20 Claims, 5 Drawing Sheets

US 10,474,785 B2

PRINTED CIRCUIT BOARD VOID INFORMATION GENERATION USING PARAMETER-BASED RULE SETS

BACKGROUND

Electronic design automation (EDA), also referred to as electronic computer-aided design (ECAD), is a category of tools for designing electronic systems such as integrated circuits, printed circuit boards, and the like. The tools work together in a design flow that chip designers use to design and analyze entire semiconductor chips. Since a modern semiconductor chip can have billions of components, EDA tools are essential for their design.

SUMMARY

According to some implementations, a device may include one or more processors to receive void configuration information that identifies a set of rules for generating void information based on printed circuit board (PCB) design information, and receive, based on receiving the void configuration information, the PCB design information that identifies via information of a PCB. The one or more processors may compare, based on receiving the PCB design information, the set of rules, associated with the void configuration information, and the via information associated with the PCB design information, and may generate the void information based on comparing the set of rules, associated with the void configuration information, and the via information associated with the PCB design information. The void information may include a set of parameters associated with a set of voids to be included in the PCB design. The one or more processors may perform an action based on generating the void information.

According to some implementations, a non-transitory computer-readable medium may store instructions that include one or more instructions that, when executed by one or more processors, cause the one or more processors to receive void configuration information that identifies a set of rules for generating void information based on printed circuit board (PCB) design information, and receive, based on receiving the void configuration information, the PCB design information that identifies via information of a PCB. The one or more instructions may cause the one or more processors to compare, based on receiving the PCB design information, the set of rules, associated with the void configuration information, and the via information associated with the PCB design information, and generate the void information based on comparing the set of rules, associated with the void configuration information, and the via information associated with the PCB design information. The void information may include a set of parameters associated with a set of voids to be included in the PCB design. The one or more instructions may cause the one or more processors to perform an action based on generating the void information.

According to some implementations, a method may include receiving, by a device, void configuration information that identifies a set of rules for generating void information based on printed circuit board (PCB) design information, and receiving, by the device and based on receiving the void configuration information, the PCB design information that identifies via information of a PCB. The method may include comparing, by the device and based on receiving the PCB design information, the set of rules, associated with the void configuration information, and the via information associated with the PCB design information, and generating, by the device, the void information based on comparing the set of rules, associated with the void configuration information, and the via information associated with the PCB design information. The void information may include a set of parameters associated with a set of voids to be included in the PCB design. The method may include performing, by the device, an action based on generating the void information.

DETAILED DESCRIPTION

Figure 1A:
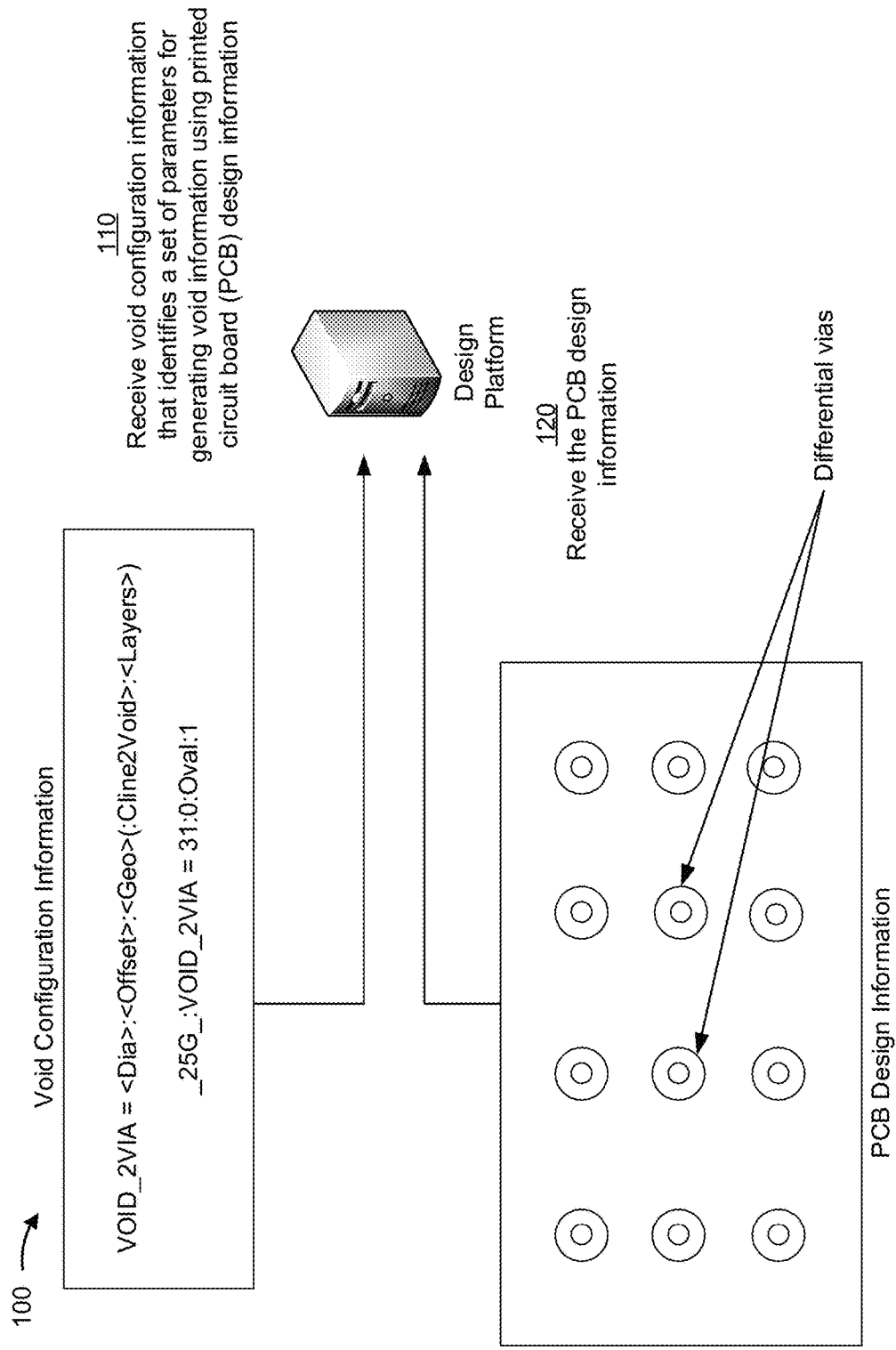
FIGS. 1A and 1B are diagrams of an overview of an example implementation described herein.

The following detailed description of example implementations refers to the accompanying drawings. The same reference numbers in different drawings may identify the same or similar elements.

A printed circuit board (PCB) can include one or more material layers that mechanically support and electrically connect electronic components using conductive traces. The conductive traces might be etched from copper sheets laminated onto a non-conductive substrate. The conductive traces might be organized as a number of layers on the PCB in order to increase the signal transmission density of the PCB. A PCB, after being populated with electronic components, is commonly referred to as a printed circuit assembly (PCA).

Vertically disposed vias can route signals from one horizontally disposed layer of a PCB to another horizontally disposed layer of the PCB. A via might be encompassed by a void, such as an area of the PCB on which conductive traces might not be placed, might not be etched, and the like. For example, a void, on a particular layer of the PCB, can encompass a via and can function to isolate the via from conductive traces on the PCB layer traversed by the via, and/or can function to provide clearance for backdrilling of the PCB.

When designing a PCB using PCB design software, a PCB engineer might be required to specify particular areas of the PCB that are to include voids. For example, a PCB engineer might, using a user device, generate void information that specifies particular areas of the PCB, that is being designed, on which conductive traces might not be placed, etched, and the like. In some cases, each via, of the PCB that is being designed, might require a respective void. As such, void information might be required to be generated for each via. In practice, a PCB can include thousands, millions, etc. of vias and/or components that necessitate voids. Thereby, manual generation of void information might prove impossible, impractical, error-prone, time-consuming, and the like.

Some implementations described herein provide a design platform that may automatically generate void information using PCB design information. In other words, some implementations described herein provide a design platform that may receive a PCB design file, parse the PCB design file, and modify the PCB design file to include void information. In this way, some implementations described herein permit automatic generation of void information, reduce errors associated with void information generation, reduce an amount of time associated with void information generation, reduce an amount of computational resources required to generate void information, and the like.

Although the term "printed circuit board" will be generally used herein as an example of a substrate for electronic components, in alternative possible implementations, a PCB may be replaced with other substrates or devices, such as, for example, rigid-flex circuits, semiconductor packages, multichip carrier modules (MCMs), micro electro mechanical systems (MEMS), ceramic circuits, midplanes, backplanes, and/or other types of substrates.

Figure 1B:
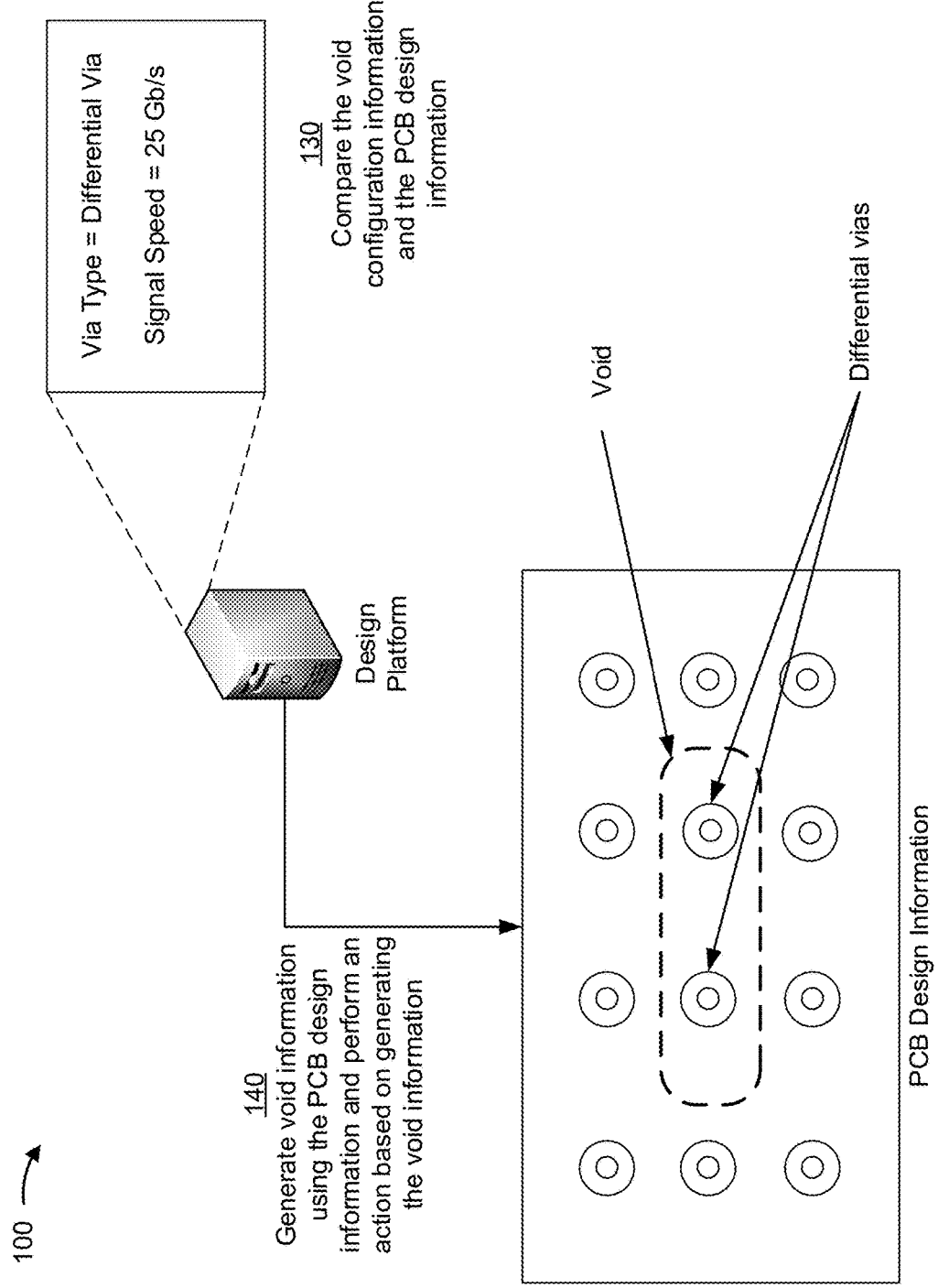

FIGS. 1A and 1B are diagrams of an overview of an example implementation 100 described herein. As shown in FIG. 1A, and by reference number 110, a design platform may receive void configuration information that identifies a set of parameters for generating void information using printed circuit board (PCB) design information. For example, the design platform may receive, from a user device (e.g., which may have received an input from an operator), the void configuration information, and/or may retrieve the void configuration information from a memory location at which the void configuration information is stored.

As used herein, void configuration information may refer to information that permits a design platform to automatically generate void information. As used herein, void information may refer to information that identifies an area of a PCB that is to include a void. As used herein, a void may refer to an area of a PCB on which a conductive trace is not to be placed, etched, and the like. As used herein, PCB design information may refer to information associated with a PCB that is being designed, configured, modified, and the like.

As shown, the void configuration information may include a rule that includes a set of parameters. For example, the rule may include a set of parameters, shown as "VOID_2VIA," "Dia," "Offset," "Geo," "Cline2Void," and "Layers." "VOID_2VIA" may identify that the rule is applicable to differential vias. "Dia" may refer to a diameter of the void. "Offset" may refer to an offset value associated with a center of a via and a center of the void. "Geo" may refer to a geometry of the void. "Cline2Void" may refer to a minimum distance between an edge of the void and a conductive trace. "Layers" may refer to the layers of the PCB for which the void information is to be generated.

As shown, the rule may include particular parameter values, shown as "25 G," "31," "0," "Oval," and "1." For example, "25 G" may identify that the rule is applicable to vias that carry signals having signal speeds of twenty five gigabits per second (Gb/s). "31" may identify that a diameter of the void is to be thirty one mils (e.g., thousandths of an inch). "0" may identify that an offset value is to be zero. "Oval" may identify that a shape of the void is to be oval. "1" may identify that void information is to be generated for each layer of the PCB.

While a particular rule and particular values are shown, it should be understood that implementations herein include other rule structures and other values. Additionally, while a single rule is shown, it should be understood that, in practice, the design platform may receive information associated with thousands, millions, etc. of rules. Thus, some implementations herein permit void information to be generated based on such a large number of rules that might not be capable of being implemented by a human operator, might be prone to implementation errors, and the like.

As further shown in FIG. 1A, and by reference number 120, the design platform may receive the PCB design information. The PCB design information may include a PCB design file, or a set of files, associated with a PCB that is being designed for manufacture. As an example, the PCB design information may include layer information associated with a set of layers associated with the PCB, material information associated with materials of the PCB, conductive trace information associated with conductive traces of the PCB, via information associated with vias of the PCB, and/or other types of information associated with PCB design.

As shown, and as a particular example, the PCB design information may include information associated with a set of differential vias. A user device may provide, for display, the PCB design information such that the PCB that is being designed may be viewed in a two-dimensional format (e.g., with x and y coordinates), and/or may be viewed in a three-dimensional format (e.g., with x, y, and z coordinates). As shown, the PCB design information may be represented in a two-dimensional format that includes a top view of the PCB.

While particular PCB design information is shown, it should be understood that, in practice, the PCB design information may include information associated with thousands, millions, etc. of vias or other structures of the PCB, and may be represented in other formats.

As shown in FIG. 1B, and by reference number 130, the design platform may compare the void configuration information and the PCB design information. For example, the design platform may parse the PCB design information, and identify via information associated with the PCB design information. Additionally, the design platform may compare the via information and the void configuration information to determine void information that is to be generated.

As a particular example, assume that the PCB design information includes via information that identifies that a set of differential vias traverses layer one through layer ten of the PCB that is being designed, that the set of differential vias is to carry differential signals having signal speeds of 25 Gb/s, and the like. In this case, the design platform may determine a particular rule, of the void configuration information, that applies to the PCB design information (e.g., the via information). For example, the design platform may determine that the rule, shown in FIG. 1A, applies to the via information.

As shown by reference number 140, the design platform may generate void information using the PCB design information, and perform an action based on generating the void information. For example, the design platform may generate void information, using the PCB design information, such that the PCB design information includes void information in association with the via information. In other words, the design platform may modify the PCB design information to include void information that identifies a void associated with the PCB that is being designed. As shown, the set of differential vias may include a void that encompasses the set of differential vias.

In some implementations, the void information may identify that conductive traces are not to be placed, etched, and the like, in association with an area defined by the void information. In reference to FIG. 1B, conductive traces might not be placed within the oval shown in association with the PCB design information.

In some implementations, the action may correspond to modifying the PCB design information, generating a new PCB design file, providing the PCB design information for display, providing an instruction to a device to cause the PCB to be manufactured, and the like.

In this way, some implementations herein reduce errors associated with void information generation, improve accuracy of PCB design by permitting rules to be applied to PCB design information with improved accuracy, reduce an amount of time associated with PCB design, reduce computational resources needed for PCB design, and the like.

As indicated above, FIGS. 1A and 1B are provided merely as an example. Other examples are possible and may differ from what was described with regard to FIGS. 1A and 1B.

Figure 2:
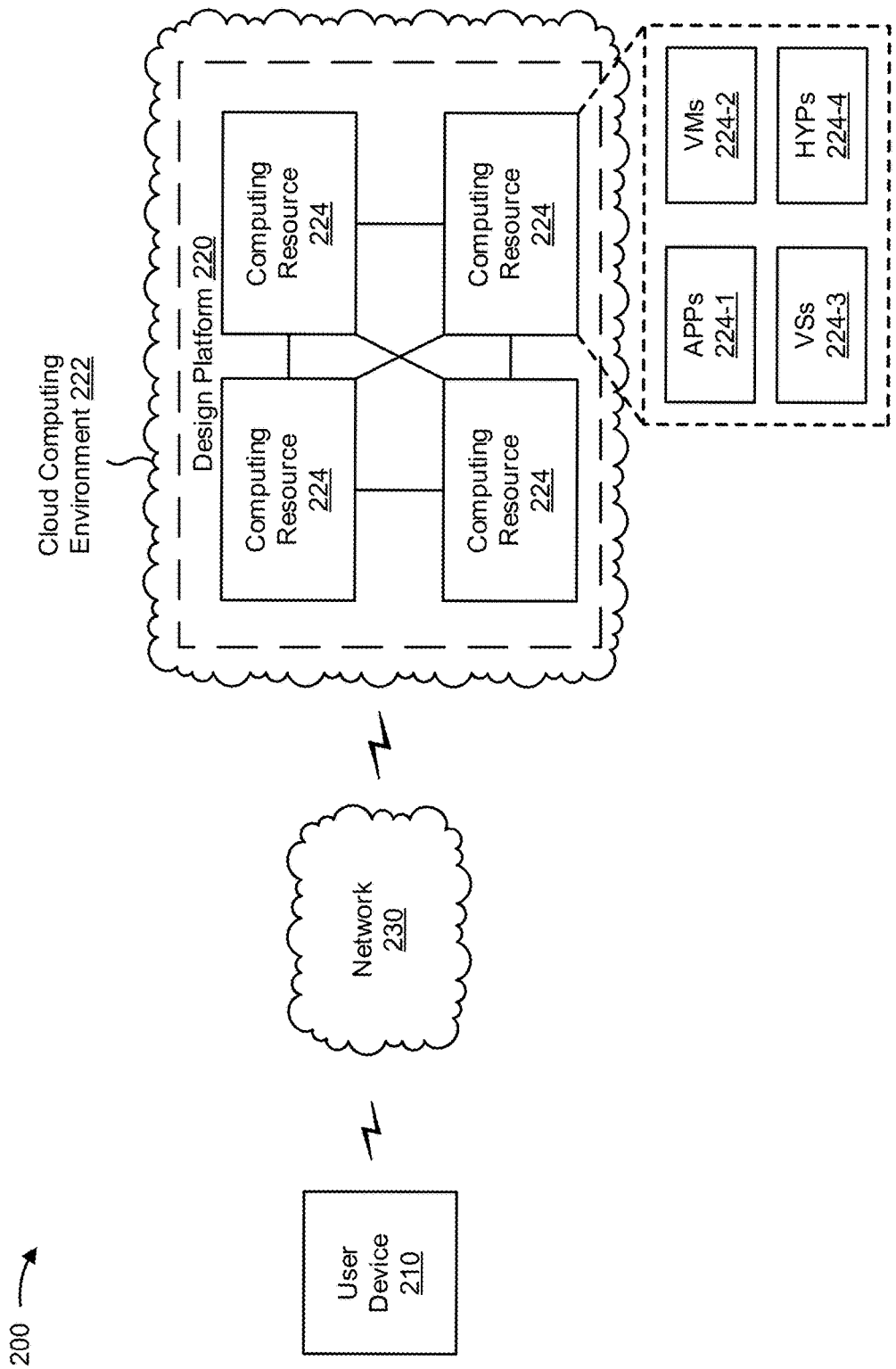
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a user device 210, a design platform 220, and a network 230. Devices of environment 200 may interconnect via wired connections, wireless connections, or a combination of wired and wireless connections.

User device 210 includes one or more devices capable of receiving, generating, storing, processing, and/or providing information associated with design platform 220. For example, user device 210 may include a device, such as a desktop computer, a laptop computer, a tablet computer, a handheld computer, a server device, a mobile phone (e.g., a smart phone or a radiotelephone), or a similar type of device.

Design platform 220 includes one or more devices capable of generating void information using parameter-based rule sets. In some implementations, design platform 220 may be designed to be modular such that certain software components may be swapped in or out depending on a particular need. As such, design platform 220 may be easily and/or quickly reconfigured for different uses.

In some implementations, as shown, design platform 220 may be hosted in a cloud computing environment 222. Notably, while implementations described herein describe design platform 220 as being hosted in cloud computing environment 222, in some implementations, design platform 220 may not be cloud-based (i.e., may be implemented outside of a cloud computing environment) or may be partially cloud-based.

Cloud computing environment 222 includes an environment that hosts design platform 220. Cloud computing environment 222 may provide computation, software, data access, storage, etc. services that do not require end-user (e.g., user device 210) knowledge of a physical location and configuration of system(s) and/or device(s) that hosts design platform 220. As shown, cloud computing environment 222 may include a group of computing resources 224 (referred to collectively as "computing resources 224" and individually as "computing resource 224").

Computing resource 224 includes one or more personal computers, workstation computers, server devices, or other types of computation and/or communication devices. In some implementations, computing resource 224 may host design platform 220. The cloud resources may include compute instances executing in computing resource 224, storage devices provided in computing resource 224, data transfer devices provided by computing resource 224, etc. In some implementations, computing resource 224 may communicate with other computing resources 224 via wired connections, wireless connections, or a combination of wired and wireless connections.

As further shown in FIG. 2, computing resource 224 includes a group of cloud resources, such as one or more applications ("APPs") 224-1, one or more virtual machines ("VMs") 224-2, virtualized storage ("VSs") 224-3, one or more hypervisors ("HYPs") 224-4, and the like.

Application 224-1 includes one or more software applications that may be provided to or accessed by user device 210. Application 224-1 may eliminate a need to install and execute the software applications on user device 210. For example, application 224-1 may include software associated with design platform 220 and/or any other software capable of being provided via cloud computing environment 222. In some implementations, one application 224-1 may send/receive information to/from one or more other applications 224-1, via virtual machine 224-2.

Virtual machine 224-2 includes a software implementation of a machine (e.g., a computer) that executes programs like a physical machine. Virtual machine 224-2 may be either a system virtual machine or a process virtual machine, depending upon use and degree of correspondence to any real machine by virtual machine 224-2. A system virtual machine may provide a complete system platform that supports execution of a complete operating system ("OS"). A process virtual machine may execute a single program, and may support a single process. In some implementations, virtual machine 224-2 may execute on behalf of a user (e.g., user device 210), and may manage infrastructure of cloud computing environment 222, such as data management, synchronization, or long-duration data transfers.

Virtualized storage 224-3 includes one or more storage systems and/or one or more devices that use virtualization techniques within the storage systems or devices of computing resource 224. In some implementations, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

Hypervisor 224-4 may provide hardware virtualization techniques that allow multiple operating systems (e.g., "guest operating systems") to execute concurrently on a host computer, such as computing resource 224. Hypervisor 224-4 may present a virtual operating platform to the guest operating systems, and may manage the execution of the guest operating systems. Multiple instances of a variety of operating systems may share virtualized hardware resources.

Network 230 includes one or more wired and/or wireless networks. For example, network 230 may include a cellular network (e.g., a fifth generation (5G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, and the like, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
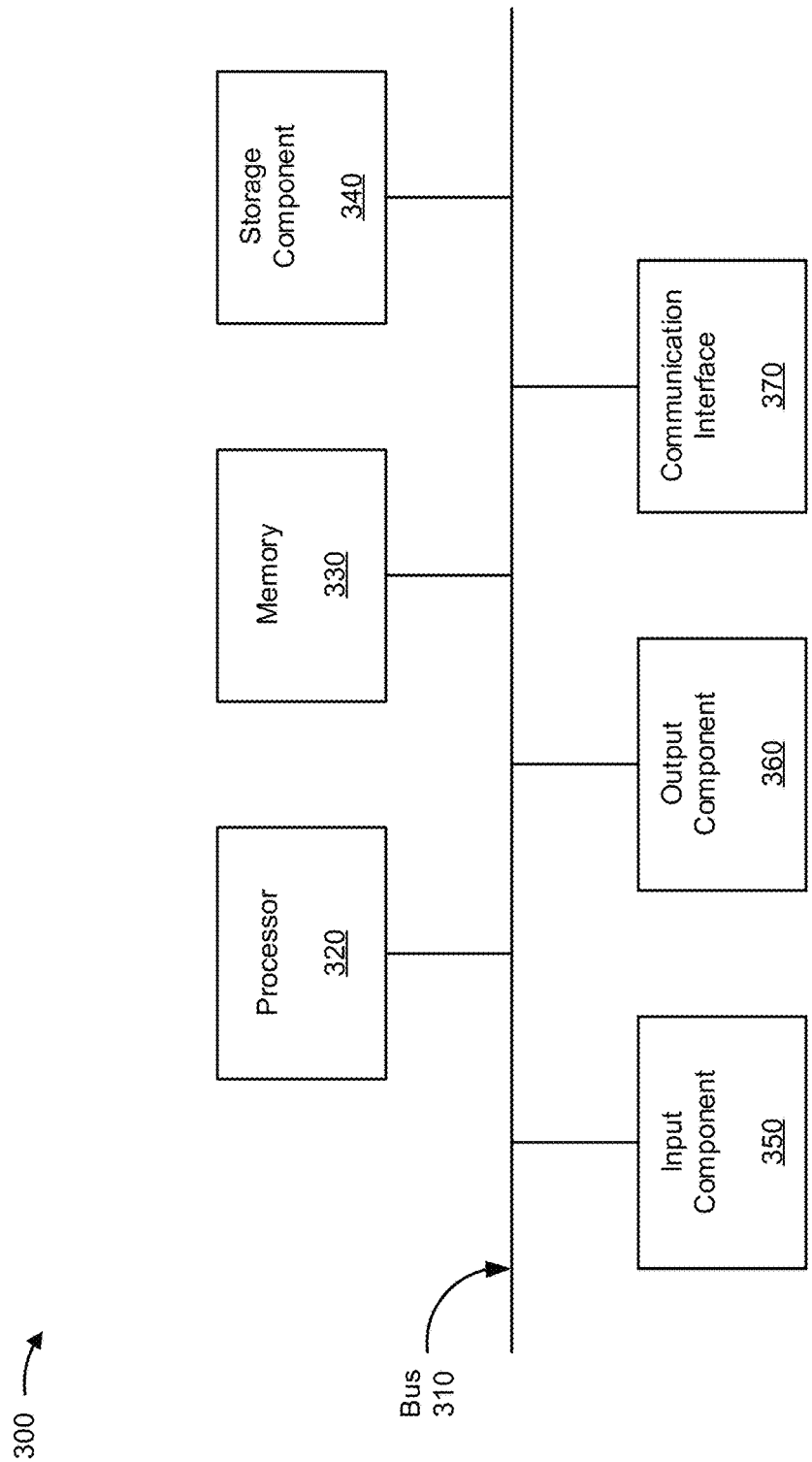
FIG. 3 is a diagram of example components of one or more devices of FIG. 2.

FIG. 3 is a diagram of example components of a device 300. Device 300 may correspond to user device 210, design platform 220, and/or computing resource 224. In some implementations, user device 210, design platform 220, and/or computing resource 224 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 takes the form of a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, an universal serial bus (USB) interface, a Wi-Fi interface, a cellular network interface, or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
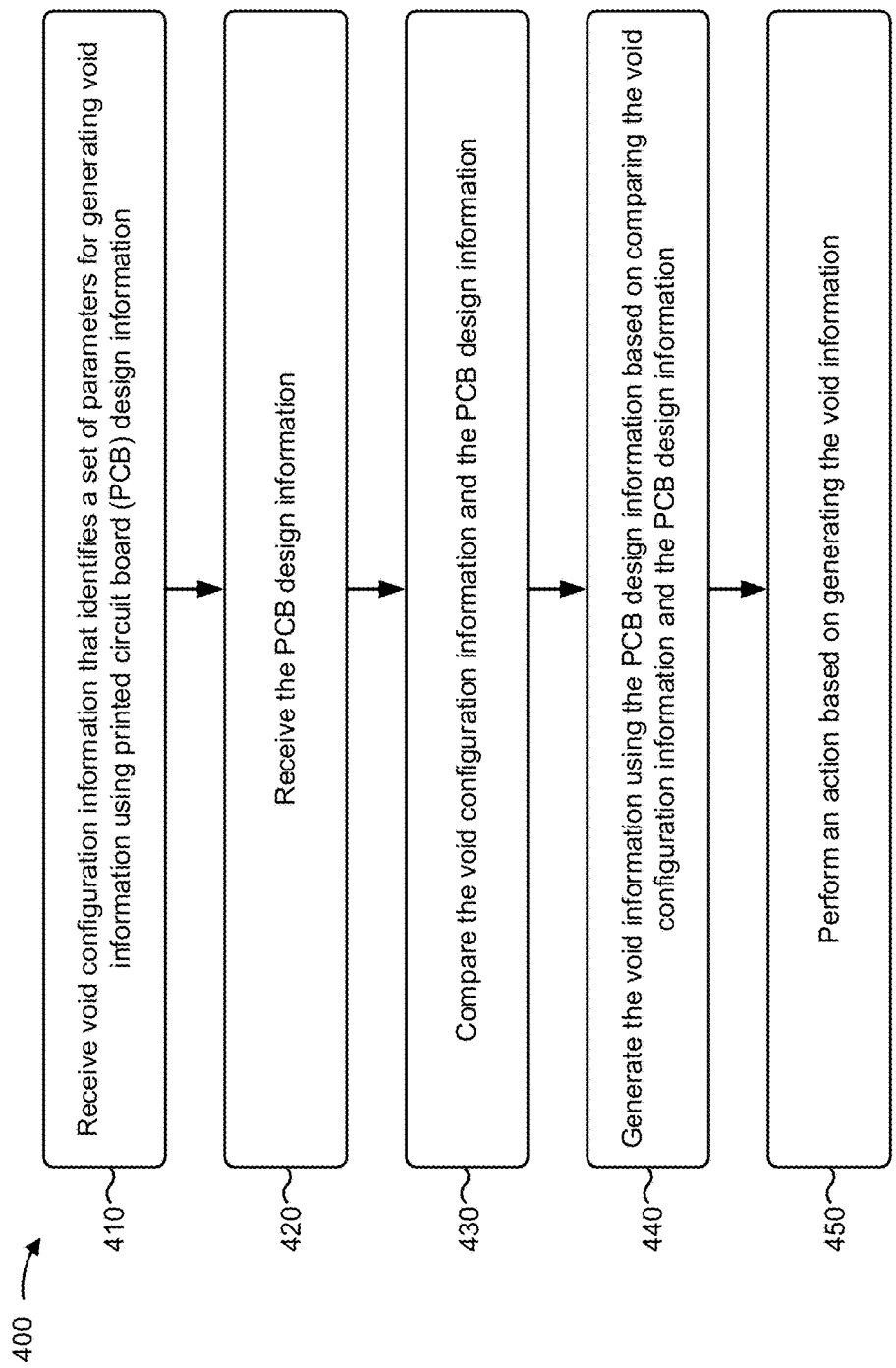
FIG. 4 is a flow chart of an example process for generating void information using parameter-based rule sets.

FIG. 4 is a flow chart of an example process 400 for generating void information using parameter-based rule sets. In some implementations, one or more process blocks of FIG. 4 may be performed by design platform 220. In some implementations, one or more process blocks of FIG. 4 may be performed by another device or a group of devices separate from or including design platform 220, such as user device 210.

As shown in FIG. 4, process 400 may include receiving void configuration information that identifies a set of parameters for generating void information using printed circuit board (PCB) design information (block 410). For example, design platform 220 may receive, from user device 210, void configuration information that permits design platform 220 to generate void information using PCB design information.

In some implementations, design platform 220 may use void configuration information to generate void information using PCB design information. In some implementations, PCB design information may refer to information associated with a PCB design, layout, stack-up, and the like. For example, PCB design information may include a PCB design file, a set of PCB design files, and the like.

In some implementations, void configuration information may refer to information that includes a set of parameters and/or rules for generating void information. In some implementations, void information may refer to information, associated with PCB design information, that is associated with a void. In other words, void information may specify a set of areas of a PCB that is to include voids.

In some implementations, design platform 220 may receive, from user device 210, void configuration information. For example, a PCB engineer may, using user device 210, input void configuration information, and design platform 220 may receive the void configuration information based on the input. Additionally, or alternatively, design platform 220 may receive information that identifies a memory location at which the void configuration information is stored, and may retrieve the void configuration information from the memory location.

Additionally, or alternatively, design platform 220 may generate void configuration information based on a model. For example, design platform 220 may receive information including known PCB designs and known void information, and train a model using the known information. In some implementations, design platform 220 may use machine learning techniques to analyze data (e.g., training data, such as historical data, etc.) and train models. The machine learning techniques may include, for example, supervised and/or unsupervised techniques, such as artificial networks, Bayesian statistics, learning automata, Hidden Markov Modeling, linear classifiers, quadratic classifiers, decision trees, association rule learning, and the like. In some implementations, design platform 220 may use another kind of computer-implemented technique, such as artificial intelligence, machine perception, or computer vision, to analyze PCB design information and generate void configuration information.

In some implementations, the void configuration information may include a set of parameters and/or rules that is to be used when generating void information. In some implementations, a parameter may include information associated with a via for which the void information is to be generated. For example, a parameter may include information that identifies a type of via, such as a single via, a differential via, a transmit via, a receive via, a stub via, a through via, a signal via, a ground via, a blind via, a micro via, a buried via, a skip via, a back-drilled via, and the like. Additionally, or alternatively, a parameter may include information that identifies a signal speed or a range of signal speeds associated with a via, such as five gigabits per second (Gb/s), twenty five Gb/s, ten Gb/s through twenty Gb/s, and the like.

In some implementations, a parameter may include information associated with a dimension of a via, such as a diameter, a radius, and the like. Additionally, or alternatively, a parameter may include information associated with a ball-grid array (BGA) pitch associated with a set of vias. Additionally, or alternatively, a parameter may include information associated with a set of layers that is traversed by a via.

In some implementations, a parameter may include information associated with a void. For example, a parameter may include a dimension of the void, such as a diameter, a radius, a width, a length, and the like. Additionally, or alternatively, a parameter may include information associated with a shape of a void, such as a circle, an oval, a square, a rectangle, and the like.

In some implementations, a parameter may include information associated with an offset associated with a void. For example, an offset may refer to an offset between a center of a via and a center of a void. As an example, an offset of zero may indicate that a center associated with a via is to align with a center of a void.

In some implementations, a parameter may include information associated with a conductive trace to void distance. For example, a conductive trace to void distance may identify a minimum distance at which a conductive trace may be placed in association with a void. As an example, a conductive trace to void distance value of one (e.g., millimeter) may identify that a copper trace may be placed a distance of one millimeter from the void.

In some implementations, a parameter may include information associated with a set of layers, of a PCB, for which the void is to be placed. For example, void information may be generated for some or all of the layers of the PCB.

In some implementations, the void configuration information may be in the form of a rule. For example, a rule may specify particular via information and particular void information. As an example, a rule may include the following format:

VOID_2VIA=<Dia>:<Offset>:<Geo>(:<Cline2Void>:<Layers>).

In this case, "VOID_2VIA" may identify that the void information is to be generated for a differential pair of vias, "Dia" may refer to a diameter of the void, "Offset" may refer to an offset value of the void, "Cline2Void" may refer to a conductive trace to void distance value, and "Layers" may identify a number of layers for which the void information is to be generated.

As an example, a particular instance of a rule may include the following values:

_30 G_:VOID_2VIA:BGA-1 MM=30:0:Oval:2:−1.

In this case, "30 G" may identify that the void information is to be generated for vias carrying signals having signal speeds of thirty (30) Gb/s, "BGA-1 MM" may identify that the void information is to be generated for vias having a BGA pitch of one millimeter, "30" may identify that the diameter of the void is to be thirty millimeters, "0" may identify that an offset value is zero, "Oval" may identify that the void is to include an oval shape, "2" may identify that a conductive trace to void distance is two millimeters, and "−1" may identify that the void is to be generated for every layer of the PCB. While a particular rule format and a particular rule are described herein, it should be understood that other implementations include other rule formats and other rule values.

In some implementations, design platform 220 may receive information associated with hundreds, thousands, millions, etc. of rules. Thereby, design platform 220 may apply a number of rules that a PCB engineer might not be capable of applying, might be prone to applying incorrectly, and the like.

In this way, design platform 220 may receive void configuration information, and may receive PCB design information, as described below.

As further shown in FIG. 4, process 400 may include receiving the PCB design information (block 420). For example, design platform 220 may receive PCB design information that is to be used when generating void information.

In some implementations, design platform 220 may receive, from user device 210, the PCB design information. Additionally, or alternatively, design platform 220 may receive information that identifies a memory location at which the PCB design information is stored, and may retrieve the PCB design information from the memory location.

In some implementations, PCB design information may refer to information associated with a design of a PCB, that permits a PCB to be manufactured, and the like. For example, the PCB design information may include a design file or a set of design files. In some implementations, the PCB design information may be capable of being used in association with various types of PCB design software.

In some implementations, the PCB design information may include a design of a PCB that includes a set of vias. For example, the PCB design may include thousands, millions, etc. of vias. As such, manual configuration of voids in association with the vias may prove impossible, impractical, error-prone, time intensive, subjective, and the like.

In this way, design platform 220 may parse the PCB design information, and compare the void configuration information and the PCB design information, as described below.

As further shown in FIG. 4, process 400 may include comparing the void configuration information and the PCB design information (block 430), and generating the void information using the PCB design information based on comparing the void configuration information and the PCB design information (block 440). For example, design platform 220 may compare a set of rules, associated with the void configuration information, and the PCB design information, and may generate void information in association with the PCB design information based on the comparison.

In some implementations, design platform 220 may parse the PCB design information and identify via information for which to generate void information. For example, the PCB design information may include via information that identifies vias of the PCB, such as the types of vias, dimensions of the vias, layers that are traversed by the vias, and the like. In some implementations, design platform 220 may generate void information for each via of the PCB, as identified in the PCB design information. In practice, PCB design information may include thousands, millions, etc. of vias and/or other components for which voids are to be generated. As such, some implementations described herein reduce errors associated with generating void information, reduce an amount of time associated with generating void information, and the like.

In some implementations, design platform 220 may compare the via information, that identifies the via for which to generate the void information, and a set of rules associated with the void configuration information. Additionally, or alternatively, design platform 220 may identify a particular rule, of the set of rules, that applies to the via information. Additionally, or alternatively, design platform 220 may identify, based on the particular rule, a set of parameters of the void information. That is, design platform 220 may determine dimensions associated with the void information, a shape associated with the void information, a set of layers associated with the void information, and the like.

In some implementations, design platform 220 may generate void information. For example, design platform 220 may generate void information by modifying the PCB design information (e.g., to include the void information), by generating a new file or a set of files, and the like.

In practice, design platform 220 may generate void information for thousands, millions, etc. of data items that correspond to respective via information. In this way, design platform 220 may generate the void information, and perform an action based on generating the void information, as described below.

As further shown in FIG. 4, process 400 may include performing an action based on generating the void information (block 450). For example, design platform 220 may automatically perform an action based on generating the void information.

In some implementations, the action may correspond to modifying the PCB design information. For example, design platform 220 may modify the PCB design information, that was received in association with block 420, to include the void information based on generating the void information. Additionally, or alternatively, the action may correspond to generating new PCB design information. For example, design platform 220 may generate a PCB design file that is different than a PCB design file received in association with block 420.

In some implementations, the action may correspond to sending a notification to another device. For example, design platform 220 may provide, to user device 210, a notification identifying that the void information was generated. Additionally, or alternatively, design platform 220 may provide, to a device associated with PCB manufacturing, an instruction to cause a manufacture of a PCB using the PCB design information that includes the void information.

In some implementations, design platform 220 may receive feedback information that identifies a modification to the void information. For example, a PCB engineer, using user device 210, may modify the void information that was generated in association with block 440. In this case, design platform 220 may receive information associated with the modification, and may update void configuration information, may update a model, and the like. In this way, some implementations described herein improve accuracy of void information generation by utilizing feedback information.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Some implementations described herein permit a design platform to automatically generate void information using void configuration information and PCB design information. In this way, some implementations described herein reduce errors associated with void information generation, reduce an amount of time associated with void information generation, conserve computational resources associated with devices involved with PCB design, and the like.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
a memory; and
one or more processors to:
receive void configuration information that identifies a set of rules for generating void information based on printed circuit board (PCB) design information;
receive, based on receiving the void configuration information, the PCB design information that identifies via information of a PCB;
compare, based on receiving the PCB design information, the set of rules, associated with the void configuration information, and the via information associated with the PCB design information;
generate the void information based on comparing the set of rules, associated with the void configuration information, and the via information associated with the PCB design information,
the void information including a set of parameters associated with a set of voids to be included in the PCB; and
perform an action based on generating the void information.

2. The device of claim 1, where the one or more processors are further to:
determine that the via information identifies a type of via of the PCB; and
generate the void information based on the via information that identifies the type of via of the PCB.

3. The device of claim 1, where the one or more processors are further to:
determine that the via information identifies a signal speed associated with a via of the PCB; and
generate the void information based on the via information that identifies the signal speed associated with the via of the PCB.

4. The device of claim 1, where the set of rules, associated with the void configuration information, includes a rule identifying a shape associated with a void; and
where the one or more processors are further to:
generate the void information based on the shape associated with the void.

5. The device of claim 1, where the set of rules associated with the void configuration information, includes a rule identifying a set of dimensions associated with a void; and
where the one or more processors are further to:
generate the void information based on the set of dimensions associated with the void.

6. The device of claim 1, where the one or more processors are further to:
determine that the via information identifies a set of layers, of the PCB, that is associated with a via of the PCB; and
generate the void information based on the via information that identifies the set of layers.

7. The device of claim 1, where the one or more processors are further to:
identify a rule of the set of rules associated with the void configuration information; and
generate the void information based on the rule.

8. A non-transitory computer-readable medium storing instructions, the instructions comprising:
one or more instructions that, when executed by one or more processors, cause the one or more processors to:
receive void configuration information that identifies a set of rules for generating void information based on printed circuit board (PCB) design information;
receive, based on receiving the void configuration information, the PCB design information that identifies via information of a PCB;
compare, based on receiving the PCB design information, the set of rules, associated with the void configuration information, and the via information associated with the PCB design information;
generate the void information based on comparing the set of rules, associated with the void configuration information, and the via information associated with the PCB design information,
the void information including a set of parameters associated with a set of voids to be included in the PCB; and
perform an action based on generating the void information.

9. The non-transitory computer-readable medium of claim 8, where the instructions further comprise:
one or more instructions that, when executed by the one or more processors, cause the one or more processors to:
determine that the via information identifies a type of via of the PCB; and
generate the void information based on the via information that identifies the type of via of the PCB.

10. The non-transitory computer-readable medium of claim 8, where the instructions further comprise:
one or more instructions that, when executed by the one or more processors, cause the one or more processors to:
determine that the via information identifies a signal speed associated with a via of the PCB; and
generate the void information based on the via information that identifies the signal speed associated with the via of the PCB.

11. The non-transitory computer-readable medium of claim 8, where the set of rules, associated with the void configuration information, includes a rule identifying a shape of a void; and
the instructions further comprise:
one or more instructions that, when executed by the one or more processors, cause the one or more processors to:
generate the void information based on the shape of the void.

12. The non-transitory computer-readable medium of claim 8, where the set of rules, associated with the void configuration information, includes a rule identifying a set of dimensions associated with a void; and
the instructions further comprise:
one or more instructions that, when executed by the one or more processors, cause the one or more processors to:
generate the void information based on the set of dimensions associated with the void.

13. The non-transitory computer-readable medium of claim 8, where the set of rules, associated with the void configuration information, includes a rule identifying an offset value associated with a void; and the instructions further comprise:
one or more instructions that, when executed by the one or more processors, cause the one or more processors to:
generate the void information based on the offset value associated with the void.

14. The non-transitory computer-readable medium of claim 8, where the instructions further comprise:
one or more instructions that, when executed by the one or more processors, cause the one or more processors to:
modify the PCB design information to include the void information; and
perform the action based on modifying the PCB design information to include the void information.

15. A method, comprising:
receiving, by a device, void configuration information that identifies a set of rules for generating void information based on printed circuit board (PCB) design information;
receiving, by the device and based on receiving the void configuration information, the PCB design information that identifies via information of a PCB;
comparing, by the device and based on receiving the PCB design information, the set of rules, associated with the void configuration information, and the via information associated with the PCB design information;
generating, by the device, the void information based on comparing the set of rules, associated with the void configuration information, and the via information associated with the PCB design information, the void information including a set of parameters associated with a set of voids to be included in the PCB; and
performing, by the device, an action based on generating the void information.

16. The method of claim 15, further comprising:
modifying the PCB design information to include the void information; and
performing the action based on modifying the PCB design information to include the void information.

17. The method of claim 15, further comprising:
receiving information that identifies a shape associated with a void to be generated; and
generating the void information based on the information that identifies the shape associated with the void to be generated.

18. The method of claim 15, further comprising:
receiving information that identifies a number of layers of the PCB; and
generating the void information based on the information that identifies the number of layers of the PCB.

19. The method of claim 15, further comprising:
determining that the via information identifies a number of vias of the PCB; and
generating the void information based on the via information that identifies the number of vias of the PCB.

20. The method of claim 15, further comprising:
determining that the via information identifies a type of via of the PCB; and
generating the void information based on the via information that identifies the type of via of the PCB.

* * * * *